(12) United States Patent 
Park et al.

(10) Patent No.: US 12,568,813 B2 
(45) Date of Patent: Mar. 3, 2026

(54) INTERCONNECTOR AND ELECTRONIC APPARATUS INCLUDING THE SAME

(71) Applicant: Samsung Electronics Co., Ltd., Suwon-si (KR)

(72) Inventors: Youngseok Park, Yongin-si (KR); Eunji Yang, Seoul (KR); Junyoung Kwon, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 437 days.

(21) Appl. No.: 18/145,490

(22) Filed: Dec. 22, 2022

(65) Prior Publication Data 
US 2023/0207467 A1 Jun. 29, 2023

(30) Foreign Application Priority Data

Dec. 27, 2021 (KR) ........................ 10-2021-0188989

(51) Int. Cl. 
*H01L 23/532* (2006.01) 
*H01L 21/311* (2006.01) 
*H01L 21/321* (2006.01) 
*H01L 23/522* (2006.01)

(52) U.S. Cl. 
CPC ...... *H01L 23/53252* (2013.01); *H01L 21/311* (2013.01); *H01L 21/321* (2013.01); *H01L 23/5226* (2013.01)

(58) Field of Classification Search 
CPC ........... H01L 23/53252; H01L 23/5226; H01L 21/311; H01L 21/321 
USPC ....................................................... 257/741 
See application file for complete search history.

(56) References Cited

U.S. PATENT DOCUMENTS

| | | | |
|---|---|---|---|
| 6,096,434 A | 8/2000 | Yano et al. | |
| 6,296,701 B1 | 10/2001 | Christen et al. | |
| 6,426,536 B1 | 7/2002 | Misewich et al. | |
| 6,555,256 B1 | 4/2003 | Christen et al. | |
| 6,645,851 B1 * | 11/2003 | Ho ...................... | H01L 21/0273 |
| | | | 438/626 |
| 6,815,297 B1 * | 11/2004 | Krivokapic ........ | H10D 30/0323 |
| | | | 257/E29.151 |
| 6,921,712 B2 * | 7/2005 | Soininen ........... | H01L 21/76814 |
| | | | 257/E21.171 |
| 6,979,435 B1 | 12/2005 | Shahriari et al. | |

(Continued)

FOREIGN PATENT DOCUMENTS

| | | |
|---|---|---|
| JP | 07-094681 A | 4/1995 |
| JP | 10-269842 A | 10/1998 |

(Continued)

OTHER PUBLICATIONS

Extended European Search Report dated Jun. 13, 2023 issued in European Patent Application No. 22216982.3-1211 / 4202993.

(Continued)

*Primary Examiner* — Tu-Tu V Ho 
(74) *Attorney, Agent, or Firm* — Harness, Dickey & Pierce, P.L.C.

(57) ABSTRACT

Provided are an interconnector and an electronic apparatus including the interconnector. The interconnector includes: a metal layer; a dielectric layer surrounding at least a portion of the metal layer; and an interlayer disposed between the metal layer and the dielectric layer and including a ternary metal oxide.

20 Claims, 16 Drawing Sheets

<u>200</u>

(56) References Cited

U.S. PATENT DOCUMENTS

| | | |
|---|---|---|
| 7,252,794 B2 | 8/2007 | Suzuki |
| 7,623,370 B2 | 11/2009 | Toda et al. |
| 7,633,790 B2 | 12/2009 | Rinerson et al. |
| 7,889,539 B2 | 2/2011 | Rinerson et al. |
| 7,951,348 B2 | 5/2011 | Shahriari et al. |
| 8,183,594 B2 | 5/2012 | Ishida et al. |
| 8,415,556 B2 | 4/2013 | Singh et al. |
| 8,675,389 B2 | 3/2014 | Chevallier et al. |
| 9,159,408 B2 | 10/2015 | Chevallier et al. |
| 9,570,515 B2 | 2/2017 | Chevallier |
| 2005/0167715 A1 | 8/2005 | Higuchi et al. |
| 2006/0234442 A1 | 10/2006 | Yamazaki et al. |
| 2007/0138459 A1* | 6/2007 | Wong ............... C01G 25/006 |
| | | 977/811 |
| 2007/0207587 A1 | 9/2007 | Kim et al. |
| 2007/0285969 A1 | 12/2007 | Toda et al. |
| 2009/0160060 A1 | 6/2009 | Hong |
| 2011/0186803 A1 | 8/2011 | Rinerson et al. |
| 2012/0299072 A1 | 11/2012 | Kim et al. |
| 2017/0025196 A1 | 1/2017 | Aksit et al. |
| 2017/0033003 A1 | 2/2017 | Song et al. |
| 2018/0114746 A1 | 4/2018 | Park et al. |
| 2019/0393298 A1* | 12/2019 | Lin ..................... H10D 84/813 |
| 2021/0123161 A1 | 4/2021 | Lee et al. |
| 2021/0202689 A1 | 7/2021 | Thareja et al. |

FOREIGN PATENT DOCUMENTS

| | | | |
|---|---|---|---|
| JP | 11-68320 | A | 3/1999 |
| JP | 11-135950 | A | 5/1999 |
| JP | 2000-022109 | A | 1/2000 |
| JP | 2003-031815 | A | 1/2003 |
| JP | 3363091 | B2 | 1/2003 |
| JP | 2004-307244 | A | 11/2004 |
| JP | 2004-307247 | A | 11/2004 |
| JP | 2004-315268 | A | 11/2004 |
| JP | 3625417 | B2 | 3/2005 |
| JP | 2006-302976 | A | 11/2006 |
| JP | 2007-243190 | A | 9/2007 |
| JP | 4457587 | B2 | 4/2010 |
| KR | 10-2009-0067454 | A | 6/2009 |
| KR | 10-2017-0014870 | A | 2/2017 |
| KR | 10-2021-0052172 | A | 5/2021 |

OTHER PUBLICATIONS

Igor Krylov et al, "Effect of the substrate on structure and properties of titanium nitride films grown by plasma enhanced atomic layer deposition" J. Vac. Sci. Technol. A, 37(6), 060905-1-060905-8 (2019).

T. Harada et al, "Electric dipole effect in PdCoO2/b-Ga2O3 Schottky diodes for high-temperature operation", Sci. Adv.;5: eaax5733 (2019).

Renhuai Wei et al, "Solution-Processable Epitaxial Metallic Delafossite Oxide Films", Adv. Funct. Mater., No. 30, 2002375, pp. 1-8 (2020).

Korean Office Action dated Nov. 20, 2025 issued in Korean Patent Application No. 10-2021-0188989.

* cited by examiner

○ :A(metal)

◉ :B(metal)

⦿ :O(oxide)

○ :A(metal)

◉ :B(metal)

◉ :O(oxide)

○ :metal

| Lattice parameters (Å) | | Mismatch (%) |
|---|---|---|
| PtCoO$_2$ | 2.83 | |
| PtCoO$_2$ | 2.83 | |
| Co(0001) | 2.51 | −11.3 |
| Ru(0001) | 2.71 | −4.2 |
| Pd(111) | 2.78 | −1.8 |
| Pt(111) | 2.75 | −2.8 |
| Rh(111) | 2.69 | −4.9 |
| Ir(111) | 2.72 | −3.9 |
| Cu(111) | 2.56 | −9.5 |
| Ag(111) | 2.89 | 2.1 |
| Au(111) | 2.88 | 1.8 |
| Al(111) | 2.86 | 1.1 |

Plasma etching (O$_2$+ C$_x$F$_y$)
SiO (CH$_3$) → SiO (OH)

| Interlayer | Dielectric | Sheet resistance | Thickness | Resistivity |
| --- | --- | --- | --- | --- |
| | | $\Omega$/sq | nm | $\Omega$ cm |
| PtCoO$_2$ | SiO$_2$/Si(100) | 39 | 12.1 | $4.7 \times 10^{-5}$ |
| | | 130 | 6.5 | $7.8 \times 10^{-5}$ |

INTERCONNECTOR AND ELECTRONIC APPARATUS INCLUDING THE SAME

CROSS-REFERENCE TO RELATED APPLICATION

This application is based on and claims priority under 35 U.S.C. § 119 to Korean Patent Application No. 10-2021-0188989, filed on Dec. 27, 2021, in the Korean Intellectual Property Office, the disclosure of which is incorporated by reference herein in its entirety.

BACKGROUND

One or more example embodiments relate to an interconnector including a ternary metal oxide, and/or an electronic apparatus including the interconnector.

Most electronic apparatuses and semiconductor devices may be manufactured by combining and connecting together semiconductors, insulators, and conductors. For example, various integrated circuits may be manufactured by forming a plurality of unit elements such as active or passive elements on a semiconductor substrate and repeatedly stacking insulating layers (interlayer insulating layers) and electrode lines on the unit elements.

However, when such electronic apparatuses or semiconductor devices are manufactured and/or operated, the temperatures of layers of the electronic apparatuses and/or semiconductor devices may increase, and/or the layers may be stressed by a voltage/current applied thereto. Due to this, the characteristics of the electronic apparatuses and/or semiconductor devices may deteriorate, and the electronic apparatuses or semiconductor devices may have poor reliability and durability.

SUMMARY

One or more example embodiments include an interconnector using a ternary metal oxide as an interlayer, and an electronic apparatus including the interconnector.

Additional aspects will be set forth in part in the description which follows and, in part, will be apparent from the description, or may be learned by practice of the presented embodiments of the disclosure.

According to one or more example embodiments, an interconnector includes a metal layer, a dielectric layer surrounding at least a portion of the metal layer, and an interlayer between the metal layer and the dielectric layer and including a ternary metal oxide.

The ternary metal oxide may include a delafossite crystal structure, e.g. a crystal structure that is the same as delafossite.

The ternary metal oxide may include an $ABO_2$ compound where A and B may be metals.

A of the ternary metal oxide may be any one of Pt, Pd, and Ag, and B of the ternary metal oxide may be any one of Co, Cr, Ni, and Rh.

The ternary metal oxide may include at least one of $PtCoO_2$, $PdCoO_2$, $PdCrO_2$, $PdRhO_2$, and $AgNiO_2$.

The interlayer may have a thickness of about 15 nm or less.

The metal layer may have a thickness of greater than or equal to about 5 nm and less than or equal to about 50 nm.

The metal layer may have a width of about 50 nm or less.

The metal layer may have a face-centered cubic structure or a hexagonal structure.

The metal layer may include at least one of Cu, Ag, Au, Al, Pt, Pd, Rh, Ir, and Ru.

The dielectric layer may have a dielectric constant of about 4 or less.

The dielectric layer may be porous.

The dielectric layer may include at least one of $SiO_2$ and $SiOCH_3$.

The interlayer may have a bulk resistivity of about $10^{-5}$ $\Omega$-cm or less.

The interlayer may have a resistivity of about $10^{-4}$ $\Omega$-cm or less.

The interlayer may include an element which is included in the dielectric layer and is not oxygen.

The dielectric layer may include a first dielectric layer defining a trench having a given depth, the interlayer may include a first interlayer on an inner wall of the trench, and the metal layer may include a first metal layer with which the trench is filled.

The dielectric layer may include a second dielectric layer defining a via hole, the interlayer may include a second interlayer on an inner wall of the via hole, and the metal layer may include a second metal layer with which the via hole is filled.

According to one or more example embodiments, an electronic apparatus includes: a device layer including at least one of a transistor, a capacitor, and a resistor; and the interconnector connected to the device layer.

The device layer may include at least one of a memory device, a display device, and an integrated circuit device.

According to some example embodiments, a method of fabricating an interposer may include provisioning a dielectric layer, forming a trench in the dielectric layer, depositing a ternary metal oxide in a sidewall of the trench, and filling the trench with a metal.

The ternary metal oxide may include any one any Pt, Pd, Ag, Co, Cr, or Ni.

The forming the trench may include performing a plasma etching process.

The metal layer may comprise at least one of Cu, Ag, Au, Al, Pt, Pd, Rh, Ir, and Ru.

A heat treatment process may be performed after filling the trench.

BRIEF DESCRIPTION OF THE DRAWINGS

The above and other aspects, features, and/or advantages of certain example embodiments will be more apparent from the following description taken in conjunction with the accompanying drawings, in which:

FIG. 10 shows resistance values measured after forming an $PtCoO_2$ interlayer on an $SiO_2$/Si dielectric layer according to some example embodiments;

DETAILED DESCRIPTION OF VARIOUS EXAMPLE EMBODIMENTS

Figure 1:
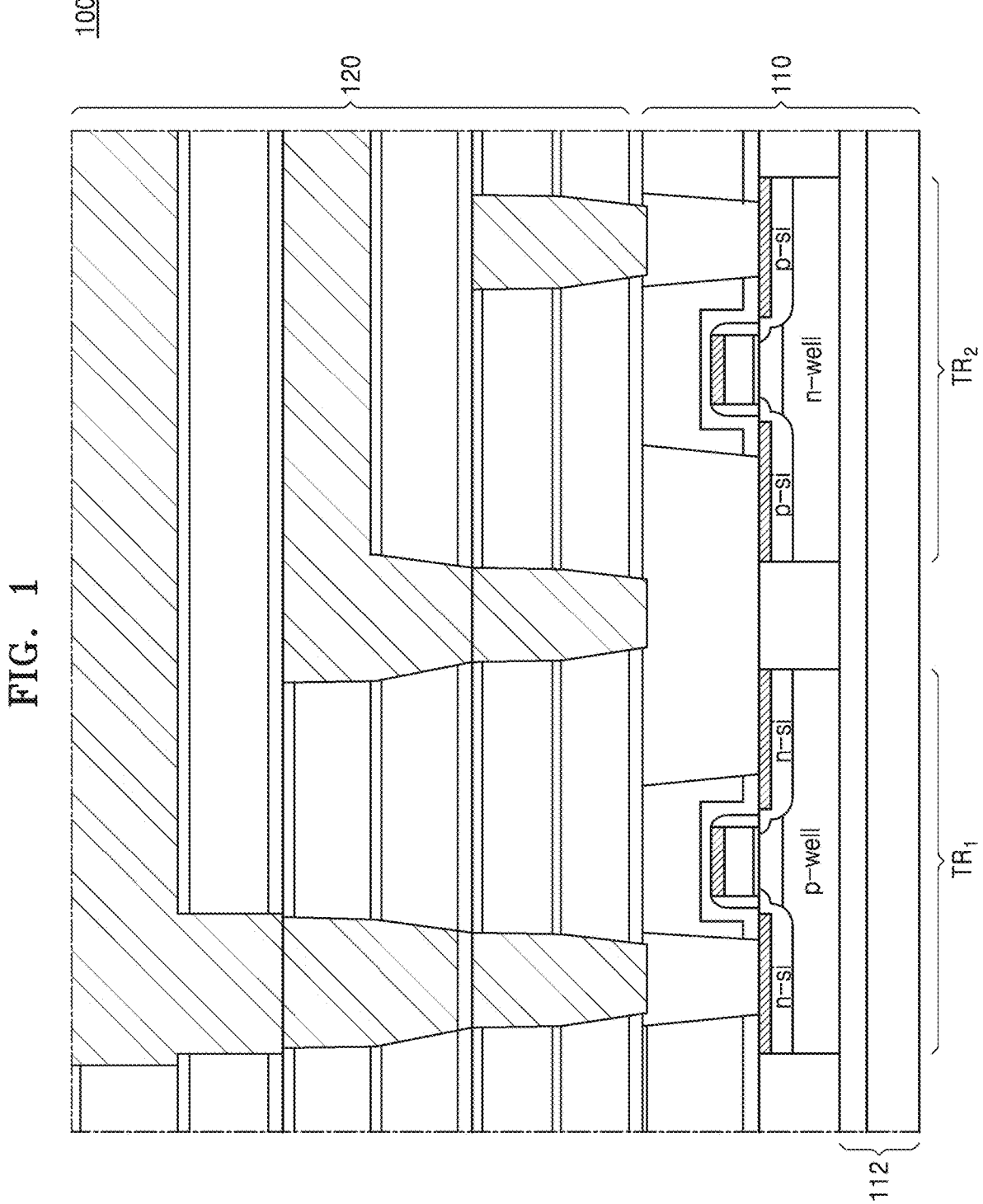
FIG. 1 is a view schematically illustrating an electronic apparatus including an interconnector according to some example embodiments.

Reference will now be made in detail to some embodiments, examples of which are illustrated in the accompanying drawings, wherein like reference numerals refer to like elements throughout. In this regard, various example embodiments may have different forms and should not be construed as being limited to the descriptions set forth herein. Accordingly, example embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, various example embodiments will be described with reference to the accompanying drawings. In the drawings, like reference numerals refer to like elements, and the sizes of elements may be exaggerated for clarity of illustration. Example embodiments described herein are for illustrative purposes only, and various modifications may be made therein.

In the following description, when an element is referred to as being "above" or "on" another element, the element may be directly on the other element while making contact with the other element or may be above the other element without making contact with the other element. The terms of a singular form may include plural forms unless otherwise mentioned. It will be further understood that the terms "comprises" and/or "comprising" used herein specify the presence of stated features or elements, but do not preclude the presence or addition of one or more other features or elements. An element referred to with the definite article or a demonstrative determiner may be construed as the element or the elements even though it has a singular form.

Operations of a method may be performed in appropriate order unless explicitly described in terms of order or described to the contrary. In addition, examples or exemplary terms (for example, "such as" and "etc.") are used for the purpose of description and are not intended to limit the scope of the inventive concept unless defined by the claims.

FIG. 1 is a view schematically illustrating an electronic apparatus 100 including an interconnector 120 according to some example embodiments. Referring to FIG. 1, the electronic apparatus 100 includes a device layer 110 and an interconnector 120 connecting the device layer 110.

The device layer 110 may include a substrate 112. For example, the substrate 112 may include one or more of a Group IV semiconductor material, a Group III/V semiconductor compound, or a Group II/VI semiconductor compound. For example, the substrate 112 may include Si, Ge, SiC, SiGe, SiGeC, Ge Alloy, GaAs, InAs, InP, or the like. However, the listed materials are merely examples, and other various semiconductor materials may be included in the substrate 112. The substrate 112 may be single-crystal and/or polycrystalline and/or amorphous. The substrate 112 may be undoped, or alternatively may be doped, e.g. lightly doped.

The substrate 112 may include a single layer or a plurality of layers in which different materials are stacked. The substrate 112 may include, for example, a silicon-on-insulator (SOI) substrate or a silicon germanium-on-insulator (SGOI) substrate. Furthermore, the substrate 112 may include a non-doped semiconductor material or a doped semiconductor material.

The device layer 110 may include one or more semiconductor devices such as a resistor, a diode, a capacitor, and/or an active device such as a diode and/or a transistor. Although two transistors TR1 and TR2 are illustrated in FIG. 1, example embodiments are not limited thereto. Furthermore although the two transistors TR1 and TR2 are illustrated as being planar transistors, example embodiments are not limited thereto. The device layer 110 may include a memory device and/or a display device including at least one active device such as a transistor and/or a diode, a capacitor, a resistor, and the like, and the electronic apparatus 100 may be or may include one or more of a system memory, a memory apparatus, a display apparatus, a mobile apparatus, or the like.

The interconnector 120 may be provided on the device layer 110. The interconnector 120 may have a structure in which a plurality of metallization layers are stacked. The metallization layers may include a metal layer and a dielectric layer.

Figure 2:
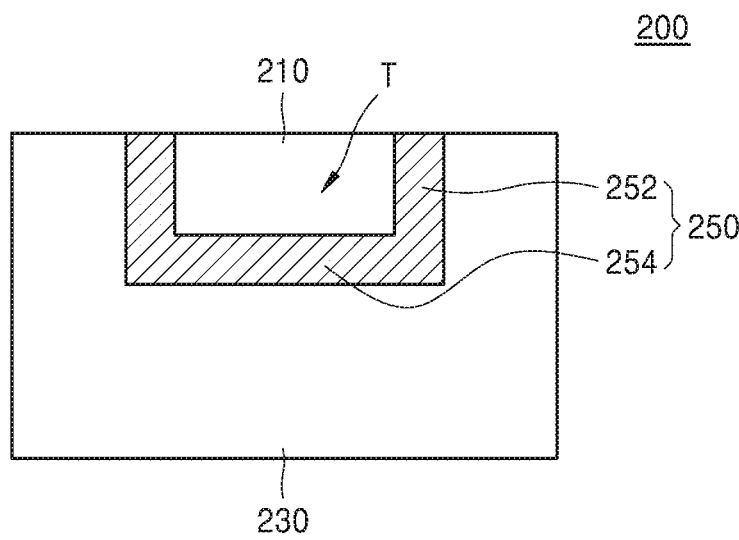
FIG. 2 is a cross-sectional view illustrating a portion of the interconnector shown in FIG. 1.

FIG. 2 is view illustrating a cross-section of an interconnector 200 (a portion of the interconnector 120 shown in FIG. 1).

Referring to FIG. 2, the interconnector 200 may include a metal layer 210, a dielectric layer 230 surrounding at least a portion of the metal layer 210, e.g. at least three sides or surfaces of the metal layer 210, and an interlayer 250 disposed between the metal layer 210 and the dielectric layer 230 and including a metal oxide.

The dielectric layer 230 may have a single-layer structure or a multi-layer structure in which different materials are stacked. The dielectric layer 230 may be formed of or may include a material having a low dielectric constant. For example, the dielectric constant of the dielectric layer 230 may be about 4 or less. The dielectric layer 230 may include one or more of a silicon oxide, a nitride, silicon nitride, silicon carbide, silicate, or the like. However, the listed materials are merely examples, and other various dielectric materials may be included in the dielectric layer 230. In addition, the dielectric layer 230 may include an organic dielectric material.

Alternatively or additionally, the dielectric layer 230 may be porous. Because pores of the dielectric layer 230 are filled with air having a relative dielectric constant of 1, the dielectric constant of the dielectric layer 230 may be lowered. For example, the dielectric layer 230 may include $SiOCH_3$. Due to the methyl radical ($CH_3$), the dielectric layer 230 may be porous.

At least one trench T may be formed in the dielectric layer 230, and the metal layer 210 may be disposed in the trench T of the dielectric layer 230. Although FIG. 2 illustrates that only one trench T is formed in the dielectric layer 230, example embodiments are not limited thereto. Two or more trenches T may be formed in the dielectric layer 230. Because the trench T is filled with the metal layer 210, the metal layer 210 which serves as a wiring line may have a small width. The width of the metal layer may be about 50 nm or less.

The metal layer 210 may include a metal and/or a metal alloy having high electrical conductivity. For example, the metal layer 210 may include at least one selected from the group consisting of or including Cu, Ag, Au, Al, Pt, Pd, Rh, Ir, and Ru. However, example embodiments are not limited thereto, and various other metals may be included in the metal layer 210.

A lower surface and both lateral surfaces of the metal layer 210 may face the dielectric layer 230. For example, the lower surface and both lateral surfaces of the metal layer 210 may be surrounded by the dielectric layer 230.

The degree of integration of devices such as active devices, e.g. transistors, increases owing to miniaturization in semiconductor manufacturing processes. When the line width of devices is reduced to obtain a high degree of integration, a resistance of the wiring may markedly increase. The increase in resistance may have deleterious effects, such as but not limited to decreasing the speed and/or increasing the power consumption of the devices. The resistance of wiring lines formed of copper (Cu), which may be used as a main material of wiring lines, may markedly increase due to scattering at grain boundaries of the wiring lines when the wiring lines have a width of about 40 nm or less which is less than the mean free path of copper (Cu). Additionally or alternatively, in a fine wiring line, the generation of Joule heat may increase due to an increase in current density. Increases in heat generation and current density may accelerate the formation of defects and voids in wiring due to electromigration.

Additionally or alternatively, when the metal layer 210 is formed above the dielectric layer 230, the physical adsorption between the dielectric layer 230 and the metal layer 210 do not spontaneously stabilize, and thus the metal layer 210 may have poor adhesion to the dielectric layer 230.

In some example embodiments, the interlayer 250 may be disposed between the dielectric layer 230 and the metal layer 210 such that the interlayer 250 induces surface adsorption of the metal layer 210 by improving the adhesion of the metal layer 210 to the dielectric layer 230 and/or stabilizing the interface between the metal layer 210 and the dielectric layer 230. For example, the interlayer 250 may include: a first interlayer 252 facing both lateral surfaces of the metal layer 210; and a second interlayer 254 facing the lower surface of the metal layer 210.

In an interconnector of related art, TiN, Co, Ru, Ta, Ti, or the like may be used as an interlayer. The materials listed above may improve the density and uniformity of wiring processes. For example, when the metal layer 210 includes Cu and the interlayer 250 includes TaN, a TaN layer may improve the reliability of wiring while suppressing diffusion of Cu. The bulk resistivity of TaN, which is about 250 $\mu\Omega$cm, is about 100 or more times the bulk resistivity of Cu, which is about 1.7 $\mu\Omega$cm. The overall resistance of wiring may be effectively reduced by reducing the thickness of the TaN layer to about 2 nm or less. However, as the thickness of the TaN layer is reduced, the resistivity of the TaN layer itself may further increase. Alternatively or additionally, in a structure in which two Cu layers are respectively disposed on upper and lower sides of a TaN layer, interfaces of the TaN layer may be bottlenecks when improving resistance.

Alternatively or additionally, Co, Ru, or W wiring may mainly use a TiN layer to induce the adhesion of Co or W to a dielectric layer and thus to ensure the processability of wiring. Although the bulk resistivity of the TiN layer is low at about 20 $\mu\Omega$cm, the resistivity of the TiN layer may significantly increase to a range of about 100 $\mu\Omega$cm to about 200 $\mu\Omega$cm or more when the TiN layer has a thickness of about 10 nm or less in an actual process. Alternatively or additionally, because the TiN layer is vulnerable to surface oxidation, a Ti(O,N)x structure may be formed during a thin-film process, and thus the resistivity of the TiN layer may further increase.

An interlayer used in the related art, such as a TaN layer or a TiN layer, may improving the adhesion of the metal layer 210 to the dielectric layer 230, but may cause interfacial resistance. As a result, the overall resistance of wiring may increase.

According to various example embodiments, the interlayer 250 may include a metal oxide having low bulk resistivity. According to various example embodiments, the bulk resistivity of the interlayer 250 may be about $1\times10^{-5}$ $\Omega$cm or less. The metal oxide may be a ternary metal oxide. The metal oxide may have a layered structure and may have, for example, a delafossite crystal structure.

According to some example embodiments, the metal oxide having a crystal structure as in a delafossite crystal structure, which may have a composition of $ABO_2$. Here, A and B may each refer to a metal. For example, A may be any one of Pt, Pd, and Ag, and B may be any one of Co, Cr, Ni, and Rh. For example, the metal oxide having a delafossite crystal structure may include at least one selected from the group consisting of or including $PtCoO_2$, $PtCoO_2$, $PdCrO_2$, $PdRhO_2$, and $AgNiO_2$.

Figure 3:
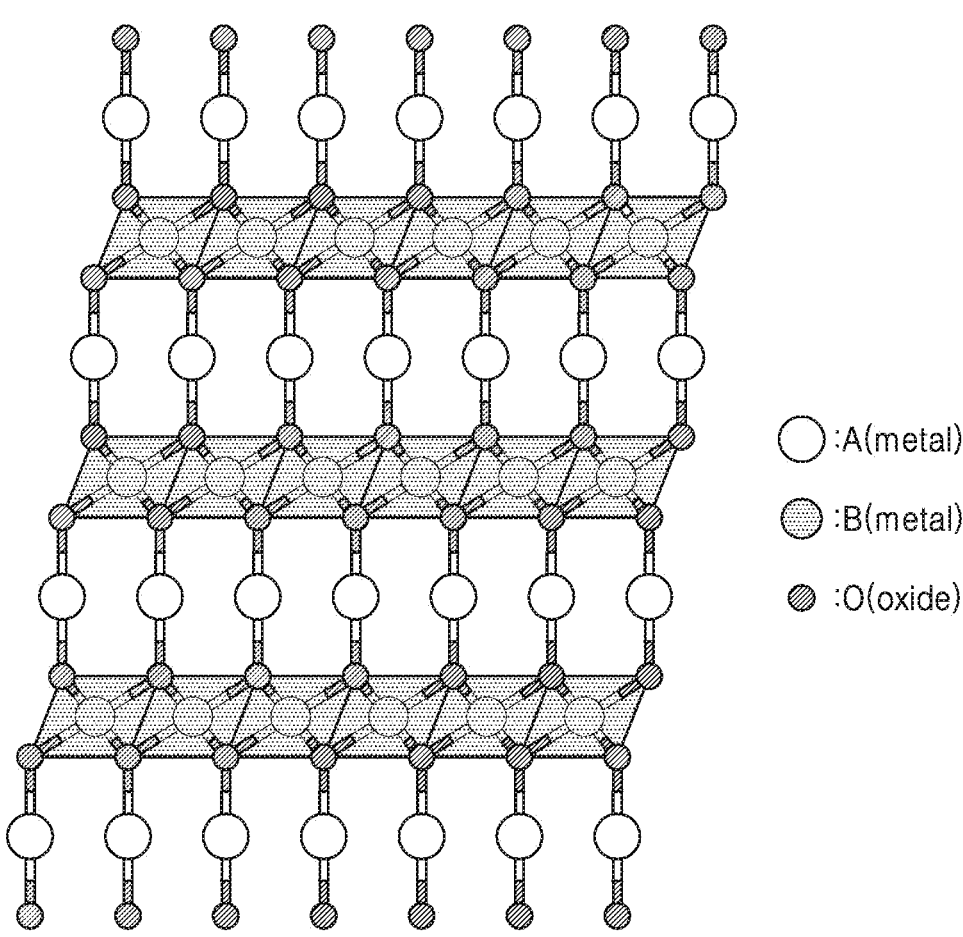
FIG. 3 is a view in which a metal oxide having a delafossite crystal structure is illustrated in an out-of-plane direction according to some example embodiments.

FIG. 3 is a view in which a metal oxide having a delafossite crystal structure is illustrated in an out-of-plane direction according to various example embodiments. Referring to FIG. 3, in the metal oxide having a delafossite crystal structure, an $AO_2$ layer and a $BO_6$ layer may be alternately arranged. The $AO_2$ layer may act as a conductive layer, and the $BO_6$ layer may act as an insulating layer. Therefore, the metal oxide having a delafossite crystal structure may have a bulk resistivity similar to or less than the bulk resistivity of most metals such as Ru, Co, and the like.

Figure 4:
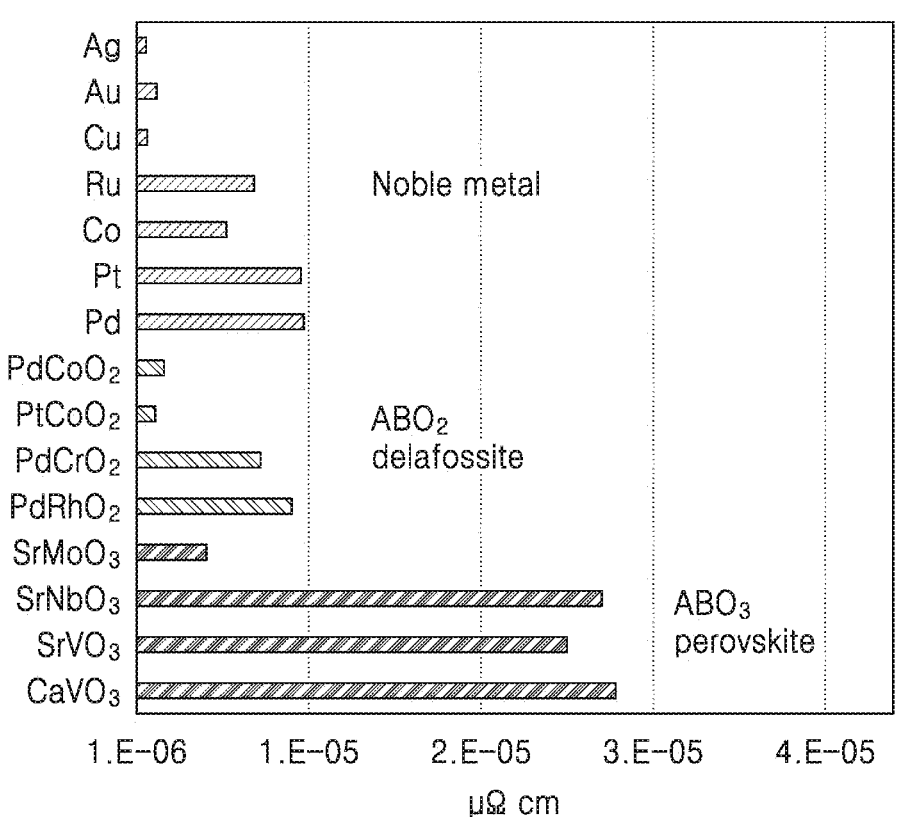
FIG. 4 is a graph illustrating the bulk resistivities of metal oxides having a delafossite crystal structure according to some example embodiments.

FIG. 4 is a graph illustrating the bulk resistivities of metal oxides having a delafossite crystal structure according to various example embodiments. Referring to FIG. 4, it may be seen that the bulk resistivities of general metals are similar to the bulk resistivities of the metal oxides having a delafossite crystal structure. The bulk resistivity of the metal oxides having a delafossite crystal structure may be about $10^{-5}$ $\mu\Omega$cm (micro-ohm centimeters) or less. However, metal oxides having a perovskite crystal structure has a resistivity greater than about $2\times10^{-4}$ $\mu\Omega$cm. Therefore, rather than using a metal oxide having a perovskite crystal structure as the interlayer 250, using a metal oxide having a delafossite crystal structure as the interlayer 250 may be effective in preventing an increase in the resistivity of the interlayer 250.

Figure 5:
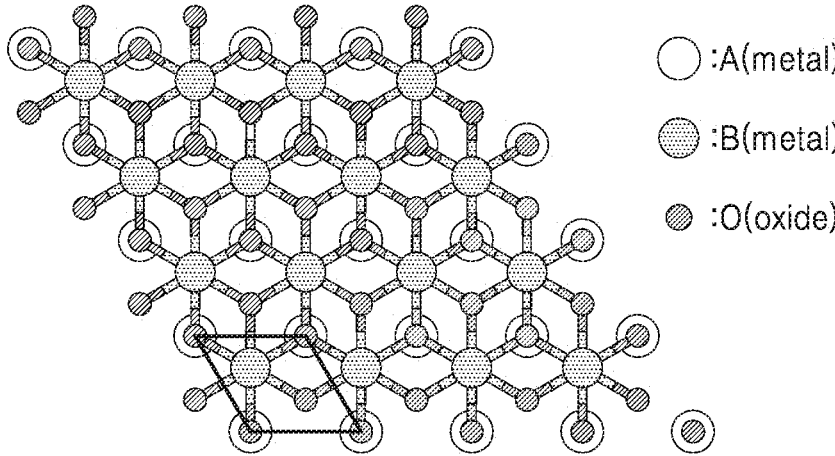
FIG. 5 is a view in which a metal oxide having a delafossite crystal structure is illustrated in an in-plane direction according to some example embodiments.

FIG. 5 is a view in which a metal oxide having a delafossite crystal structure is illustrated in an in-plane direction according to various example embodiments. Referring to FIG. 5, the metal oxide having a delafossite crystal structure is anisotropic. Thus, the metal oxide having a delafossite crystal structure may more easily grow in lateral directions even in the trench T having a small width.

Figure 6:
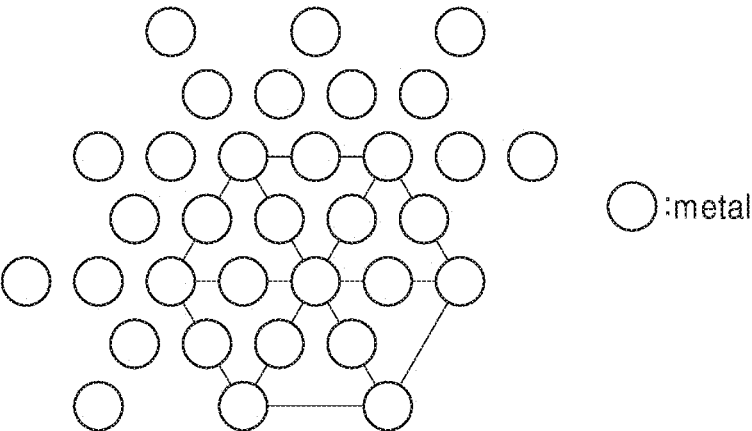
FIG. 6 is a view illustrating the crystal structure of a metal in a (111) plane according to some example embodiments.

FIG. 6 is a view illustrating the crystal structure of a metal in a (111) plane according to various example embodiments. In general, the metal layer 210 may have a face centered cubic crystal structure in the (111) plane. The metal oxide having a delafossite crystal structure shown in FIG. 6 has a hexagonal lattice structure. Thus, according to some example embodiments, the lattice constant difference between the metal oxide of the interlayer 250 and the metal of the metal layer 210 may be small, and the metal layer 210 may be easily formed on the interlayer 250 including the metal oxide.

In addition, according to some example embodiments, the interlayer 250 may include the metal oxide, the metal layer 210 may be formed on the interlayer 250, and then a heat treatment process may be performed. Then, because the metal oxide has crystallinity, the crystallinity of the metal layer 210 may be improved. An increase in the grain size of the metal layer 210 caused by improvements in the crystallinity of the metal of the metal layer 210 may have an effect on a decrease in the resistance of wiring.

According to some example embodiments, a mismatch between the lattice constant of the interlayer 250 and the lattice constant of the metal layer 210 may be about ±15% or less.

Figures 7, 8A:
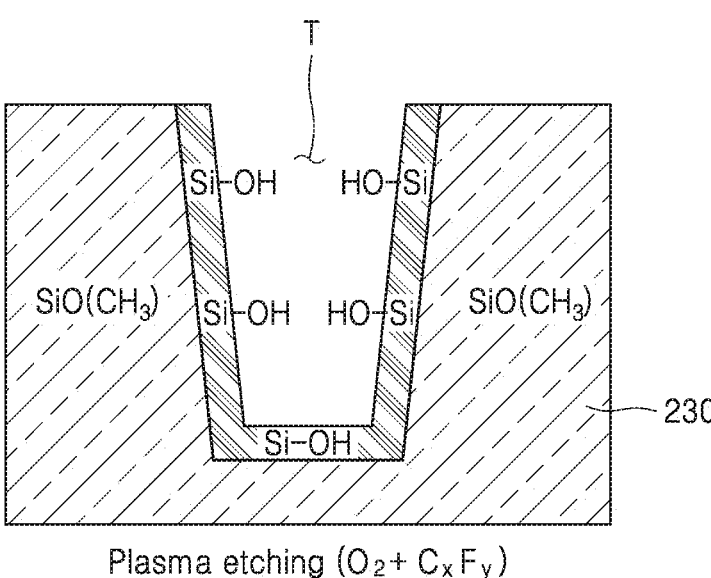
FIG. 7 is a view illustrating results of calculation of the mismatch between the lattice constant of a metal oxide included in an interlayer and the lattice constant of a metal included in a metal layer according to some example embodiments.
FIGS. 8A to 8C are example views illustrating processes of manufacturing an interconnector according to some example embodiments.

FIG. 7 is a view illustrating results of calculation of the mismatch between the lattice constant of a metal oxide included in the interlayer 250 and the lattice constant of a metal included in the metal layer 210 according to some example embodiments. It may be seen that the metal oxide having a delafossite crystal structure according to some example embodiments has a lattice parameter of about 2.8 Å to about 2.9 Å.

The lattice constant mismatch may be defined as (lattice constant of metal-lattice constant of metal oxide)/lattice constant of metal oxide. It may be seen that the metal oxide having a delafossite crystal structure has a lattice constant mismatch of about ±15% or less with respect to metals. Because the metal oxide having a delafossite crystal structure has a lattice constant slightly different from the lattice constants of metals, a metallic material may be more easily formed on the metal oxide having a delafossite crystal structure.

Figure 8B:
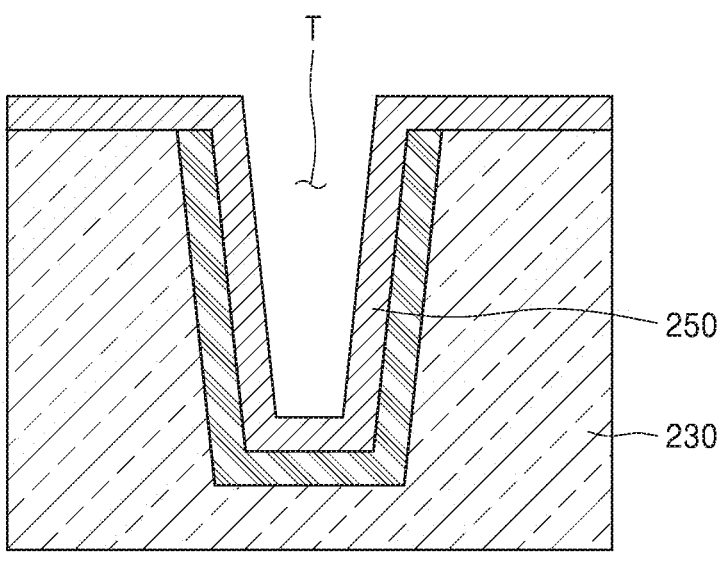
Figure 8C:
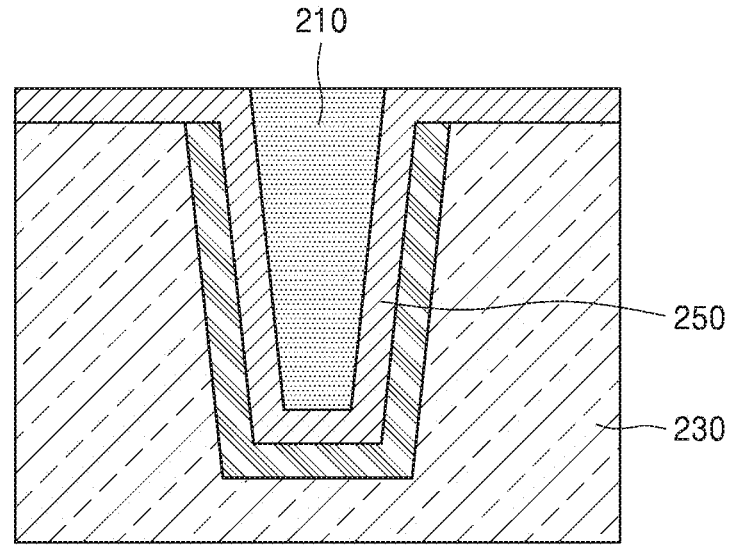

FIGS. 8A to 8C are example views illustrating processes of manufacturing an interconnector according to some example embodiments.

Referring to FIG. 8A, a trench T may be formed in a dielectric layer 230. The dielectric layer 230 may include a material having a low dielectric constant. The dielectric constant of the dielectric layer 230 may be about 4 or less. For example, the dielectric layer 230 may have a chemical structure of Si—O—$CH_3$. The dielectric layer 230 may be porous owing to —$CH_3$, and because pores of the dielectric layer 230 are filled with air having a relative dielectric constant of about 1, the dielectric constant of the dielectric layer 230 may be lowered.

The trench T may be formed in the dielectric layer 230 by one or more etching processes, such as plasma etching. The trench T may be formed by etching the surface of the dielectric layer 230 with plasma such as oxygen plasma and/or fluorocarbon plasma. The chemical structure of a region in which the trench T is formed in the dielectric layer 230 may be changed by the plasma etching. For example, the chemical structure of Si—O—$CH_3$ may be changed to an oxide chemical structure such as Si—O(OH).

Referring to FIG. 8B, an interlayer 250 may be formed by depositing a ternary metal oxide on surfaces of the dielectric layer 230 including the trench T. The ternary metal oxide may have a crystal structure as in a delafossite crystal structure. Because the ternary metal oxide has a chemical structure of A-O-B-O, spontaneous surface adsorption may be facilitated by chemical bonding with a material having a chemical structure of Si—O—OH on surfaces of the trench T. In addition, because the ternary metal oxide having a delafossite crystal structure has an anisotropic form, the ternary metal oxide having a delafossite crystal structure grows in laterals direction along the surfaces of the trench T, and thus the interlayer 250 may be easily formed even in the trench T having a small width. The thickness of the interlayer 250 may be about 15 nm or less. The width of trench T may be less than or equal to about 60 nm.

Referring to FIG. 8C, a metal layer 210 may be formed on the interlayer 250. The metal layer 210 may be formed with a vacuum deposition process and/or a sputter deposition process and/or with a chemical vapor deposition (CVD) process; however, example embodiments are not limited thereto. The metal layer 210 may be planarized, e.g. with a chemical mechanical planarization (CMP) process and/or an etch-back process; however, example embodiments are not limited thereto. The metal layer 210 may have a face-centered cubic structure or a hexagonal structure. For example, the metal layer 210 may include at least one selected from the group consisting of or including Cu, Ag, Au, Al, Pt, Pd, Rh, Ir, and Ru. The interlayer 250 has a hexagonal lattice structure in a horizontal direction, and the lattice mismatch between the ternary metal oxide of the interlayer 250 and the metal of the metal layer 210 is small on the level of ±15% or less. Thus, after forming the interlayer 250, which is crystalline, on the dielectric layer 230 which is amorphous, when the metal layer 210 is formed on the interlayer 250 and a heat treatment is performed on the metal layer 210, the interlayer 250 may increase the crystallinity of the metal layer 210. The thickness of the metal layer 210 may be about 5 nm to 50 nm. The width of the metal layer 210 in the trench T may be about 50 nm or less.

Figure 9:
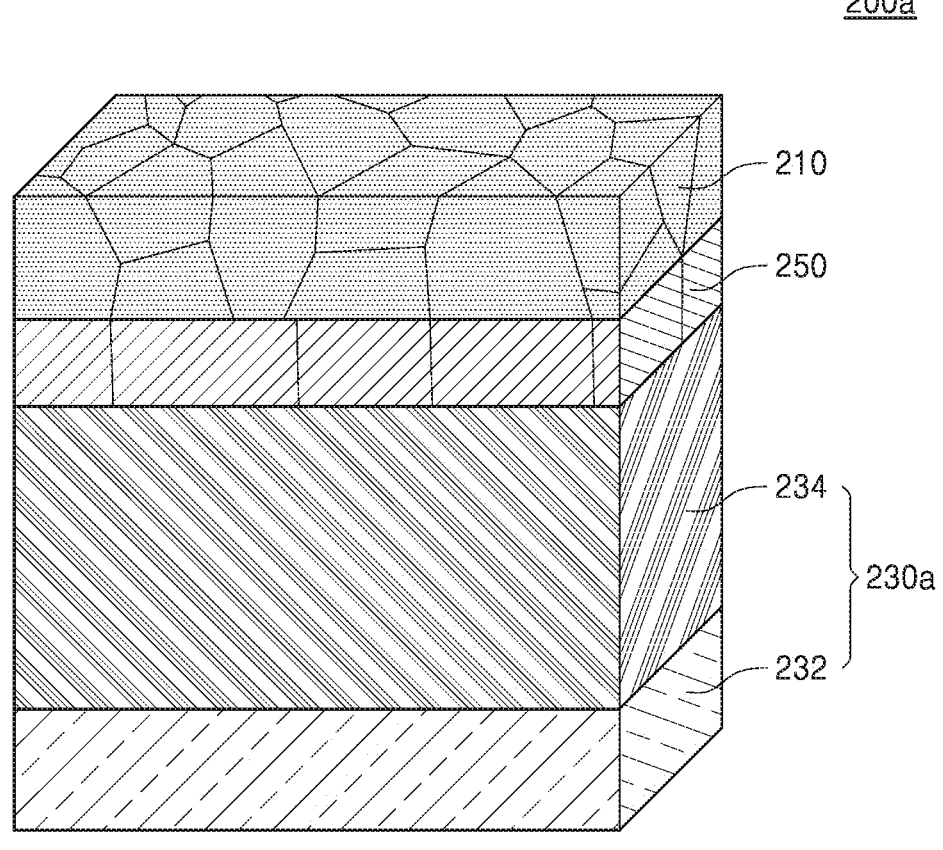
FIG. 9 is a view illustrating a thin film structure according to some example embodiments.

FIG. 9 is a view illustrating a thin film structure 200a according to some example embodiments. The thin film structure 200a shown in FIG. 9 may not include a trench T. A dielectric layer 230a may include one or more of silicon, a silicon oxide, or the like. For example, the dielectric layer 230a may include a first dielectric layer 232 including silicon and a second dielectric layer 234 including a silicon oxide. FIG. 9 illustrates that the dielectric layer 230a includes the first and second dielectric layers 232 and 234 including different materials. However, embodiments are not limited thereto. The dielectric layer 230a may be formed as a single layer and may include, for example, a silicon oxide.

An interlayer 250a may be formed on the dielectric layer 230a. The interlayer 250a may include a ternary metal oxide. The ternary metal oxide may have low resistivity and may have a crystal structure. For example, the ternary metal oxide may have a bulk resistivity of about $1 \times 10^{-5}$ $\Omega$cm (ohm-centimeters) or less. In addition, the ternary metal oxide may have a delafossite crystal structure. Because the ternary metal oxide is chemically bonded to the second dielectric layer 234, the interlayer 250 may be easily adsorbed onto the dielectric layer 230a.

The ternary metal oxide may include an $ABO_2$ compound (A and B are metals), where A may be any one of Pt, Pd, and Ag, and B may be any one of Co, Cr, Ni, and Rh. For example, the ternary metal oxide may include at least one selected from the group consisting of $PtCoO_2$, $PdCoO_2$, $PdCrO_2$, $PdRhO_2$, and $AgNiO_2$.

A metal layer 210a may be formed on the interlayer 250a. The metal layer 210a may be formed by vacuum deposition. Because the interlayer 250a has a crystalline structure, it may be easier to form the metal layer 210a on the interlayer 250a than to form the metal layer 210a on the dielectric layer 230a which is amorphous. When the ternary metal oxide having a delafossite crystal structure is heat treated after the metal layer 210a is formed, crystallization of the metal layer 210 may be increased.

The thin film structure 200a shown in FIG. 9 may serve as a wiring line. However, example embodiments are not limited thereto. The thin film structure 200a may be used as a part of a component in a semiconductor device such as a transistor and/or a capacitor.

FIG. 10 shows resistance values measured after forming an $PtCoO_2$ interlayer on an $SiO_2$/Si dielectric layer according to some example embodiments. It may be seen that sheet resistance and resistivity increase as the thickness of the $PtCoO_2$ interlayer decreases. However, the resistivity of the $PtCoO_2$ interlayer is less than about $10^{-4}$ $\Omega$cm, and thus the $PtCoO_2$ interlayer may function as an interlayer.

Figure 11:
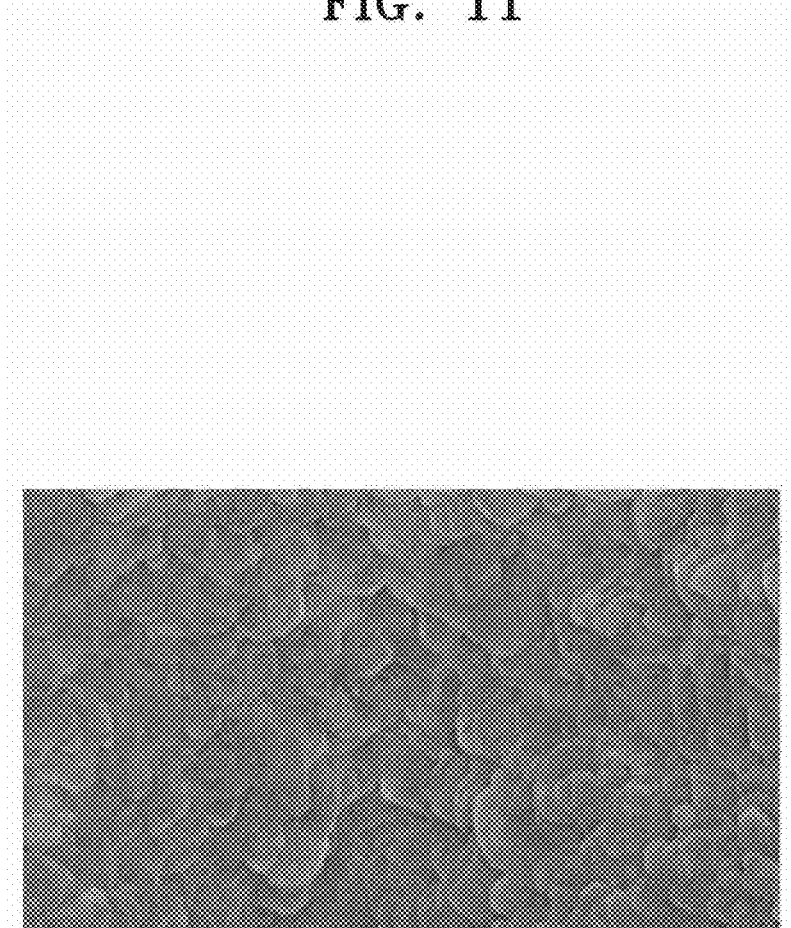
FIG. 11 is a scanning electron microscope (SEM) image showing a surface of a thin film in which an $PtCoO_2$ interlayer is formed on a $SiO_2$/Si dielectric layer according to some example embodiments.

FIG. 11 is a scanning electron microscope (SEM) image showing a surface of a thin film in which an $PtCoO_2$ interlayer is formed on a $SiO_2$/Si dielectric layer according to various example embodiments. It may be seen that the $PtCoO_2$ interlayer has crystallinity. The crystallinity of the interlayer 250 may enhance the crystallization of the metal layer 210.

Figures 12, 13:
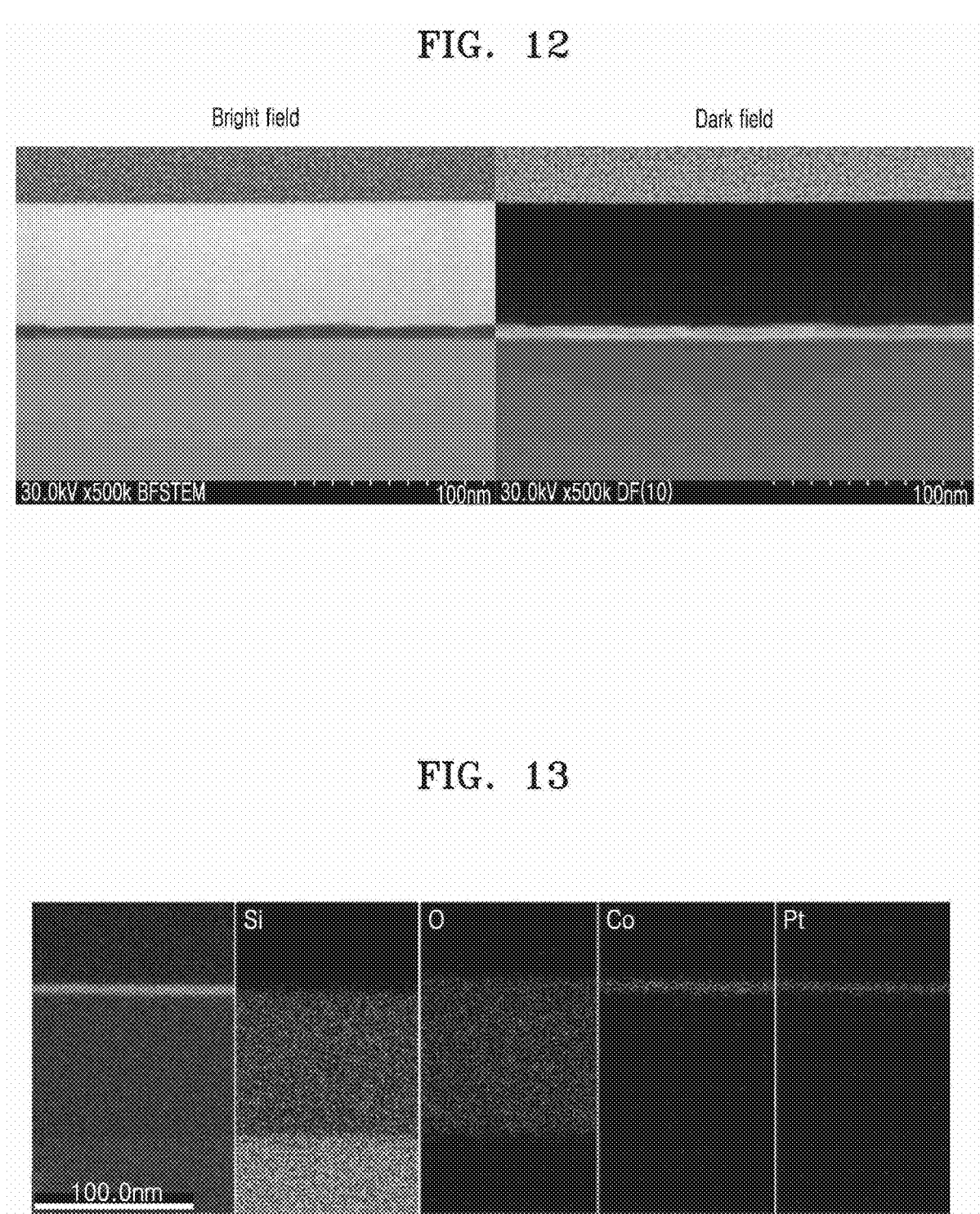
FIG. 12 is a scanning transmission electron microscope (STEM) image showing a cross-section of a thin film in which an $PtCoO_2$ interlayer is formed on a $SiO_2$/Si dielectric layer according to some example embodiments.
FIG. 13 shows energy dispersive spectroscopy (EDS) mapping of the cross-section of the thin film in which the $PtCoO_2$ interlayer is formed on the $SiO_2$/Si dielectric layer according to the embodiment.

FIG. 12 is a scanning transmission electron microscope (STEM) image showing a cross-section of a thin film in which an $PtCoO_2$ interlayer is formed on a $SiO_2$/Si dielectric layer according to some example embodiments, and FIG. 13 shows energy dispersive spectroscopy (EDS) mapping of the cross-section of the thin film in which the $PtCoO_2$ interlayer is formed on the $SiO_2$/Si dielectric layer according to the embodiment. Referring to FIGS. 12 and 13, it may be seen that the $PtCoO_2$ interlayer includes Si of the $SiO_2$/Si dielectric layer in addition to including Pt, Co, and O. This means that $PtCoO_2$ of the $PtCoO_2$ interlayer was chemically bonded to $SiO_2$ of the $SiO_2$/Si dielectric layer.

Figure 14:
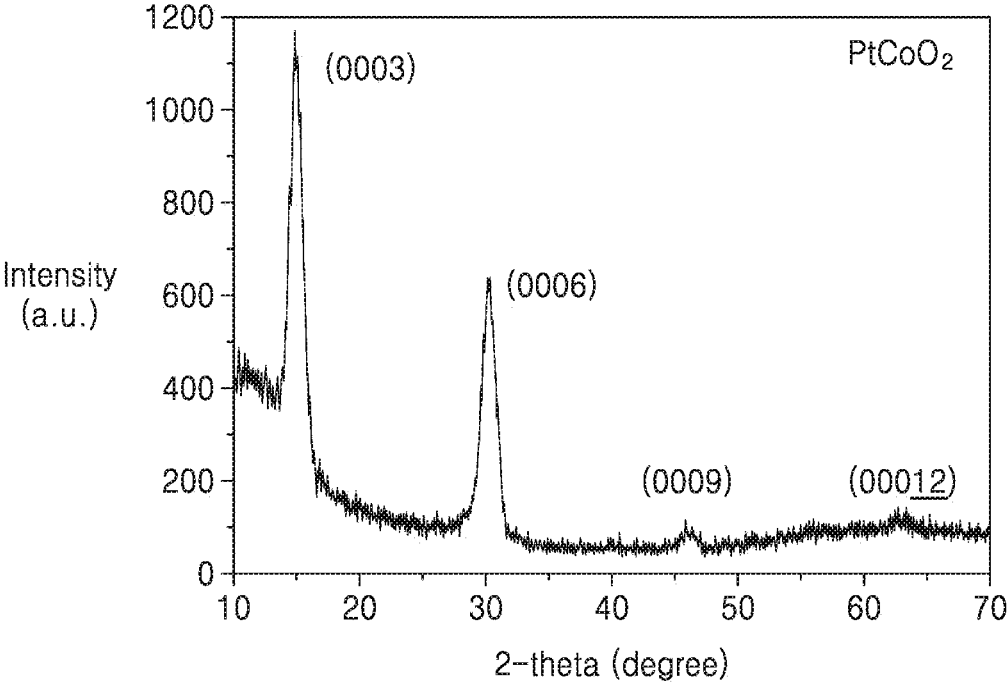
FIG. 14 is a view illustrating an X-ray diffraction (XRD) pattern of a thin film in which a $PtCoO_2$ interlayer is formed on a $SiO_2$/Si dielectric layer according to some example embodiments.

FIG. 14 is a view illustrating an X-ray diffraction (XRD) pattern of a thin film in which a $PtCoO_2$ interlayer is formed on a $SiO_2$/Si dielectric layer according to some example embodiments. Referring to FIGS. 14, (0003) and (0006) peaks are detected, showing that the $PtCoO_2$ interlayer has crystallinity.

Figure 15:
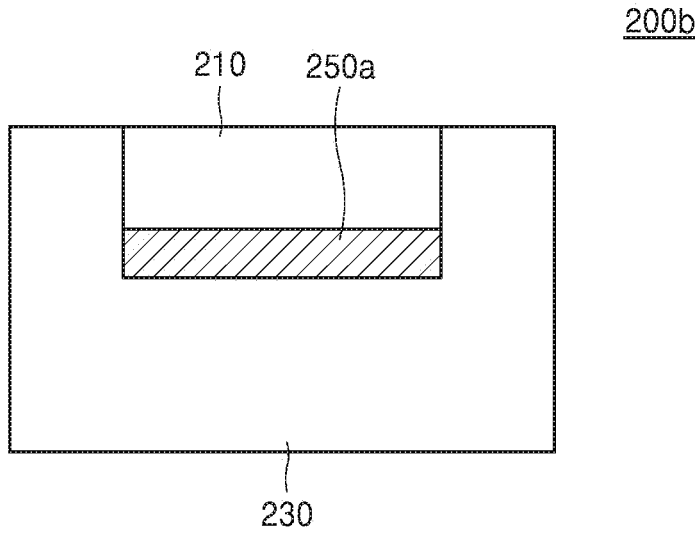
FIG. 15 is a view illustrating an interconnector according to another embodiment.

FIG. 15 is a view illustrating an interconnector 200b according to various example embodiment. Referring to FIG. 15, an interlayer 250b may be provided only on a lower wall of a trench T such that the interlayer 250b may be in contact with a lower surface of a metal layer 210.

Figure 16:
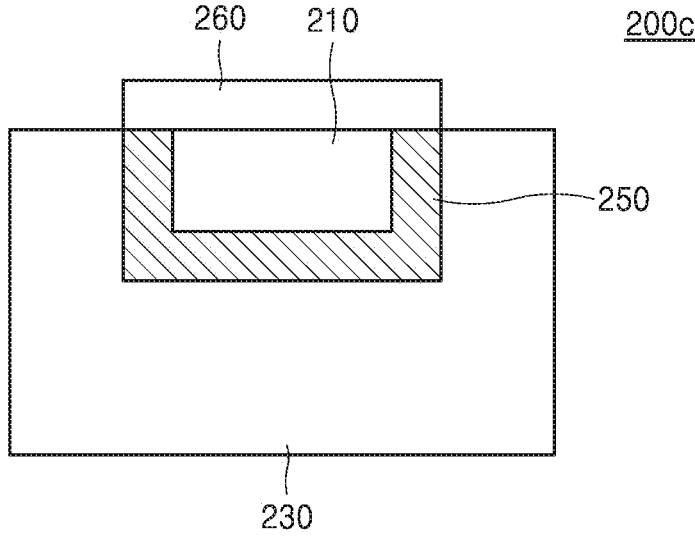
FIG. 16 is a view illustrating an interconnector including a cap layer according to some example embodiments.

FIG. 16 is a view illustrating an interconnector 200c including a cap layer 260 according to some example embodiments.

Referring to FIG. 16, the interconnector 200c may further include the cap layer 260 provided on an upper surface of a metal layer 210. The cap layer 260 may include nanocrystalline graphene. The cap layer 260 may have a single-layer structure or a multi-layer structure in which a plurality of layers are stacked. The nanocrystalline graphene may have crystals smaller than crystals of intrinsic graphene which is general crystalline graphene. For example, the nanocrystalline graphene may include crystals having a nano-size, for example, a size of about 100 nm or less. As described later, when the cap layer 260 including the nanocrystalline graphene is formed on the upper surface of the metal layer 210, the electrical resistance of the metal layer 210 may be reduced, and thus electromigration resistance may be improved.

Figure 17:
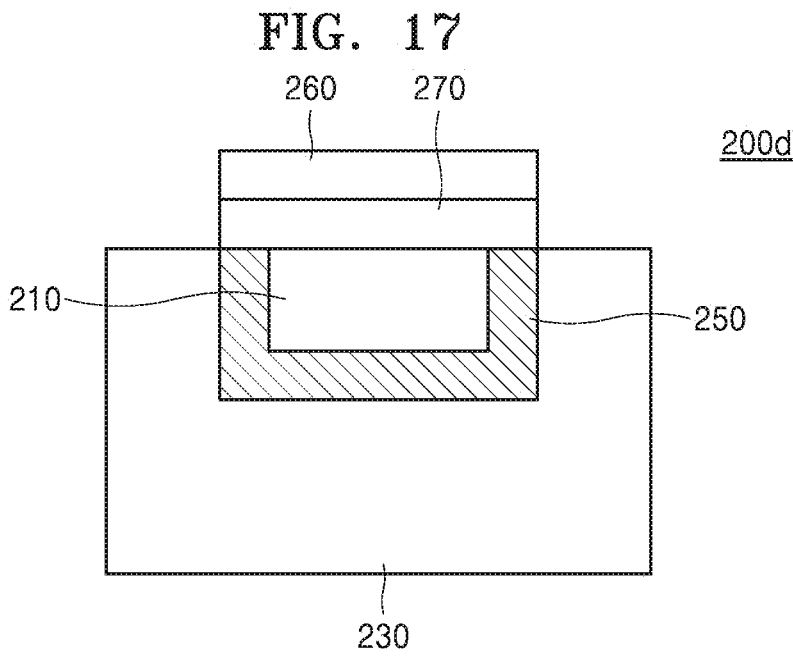
FIG. 17 is a view illustrating an interconnector including a bonding layer according to some example embodiments.

FIG. 17 is a view illustrating an interconnector 200d including a bonding layer 270 according to some example embodiments.

As shown in FIG. 17, the interconnector 200d may further include the bonding layer 270 between a cap layer 260 and a metal layer 210. Because the bonding layer 270 provides interfacial bonding between the metal layer 210 and the cap layer 260, electrical movement may be suppressed between the metal layer 210 and the cap layer 260.

The bonding layer 270 may form a carbide bond at an interface with the cap layer 260. To form the carbide bond at the interface with the cap layer 260, the bonding layer 270 may include at least one selected from the group consisting of or including magnesium (Mg), aluminum (Al), scandium (Sc), titanium (Ti), vanadium (V), chromium (Cr), manganese (Mn), nickel (Ni), copper (Cu), zinc (Zn), gallium (Ga), zirconium (Zr), niobium (Nb), molybdenum (Mo), lead (Pd), silver (Ag), cadmium (Cd), indium (In), tin (Sn), lanthanum (La), hafnium (Hf), tantalum (Ta), tungsten (W), iridium (Ir), platinum (Pt), gold (Au), bismuth (Bi), cobalt (Co), and ruthenium (Ru), or may include an alloy of the listed metals.

The cap layer 260 and the bonding layer 270 may prevent the material of the metal layer 210 from diffusing to other regions.

An interlayer may include a conductive layer of a ternary metal oxide, and the ternary metal oxide itself may serve as a wiring line.

Figure 18:
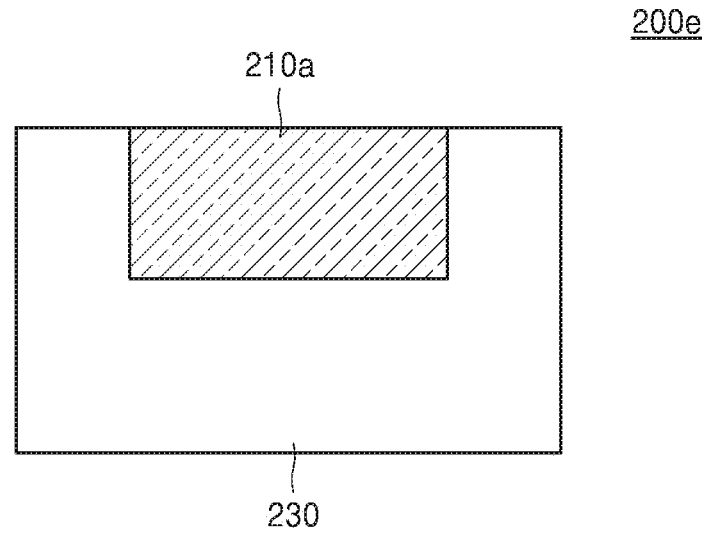
FIG. 18 is a view illustrating an interconnector according to another embodiment.

FIG. 18 is a view illustrating an interconnector 200e according to another embodiment. A metal layer 210a may include a ternary metal oxide. The ternary metal oxide has strong adhesion to a dielectric layer 230 and may serve as a wiring line.

Figure 19:
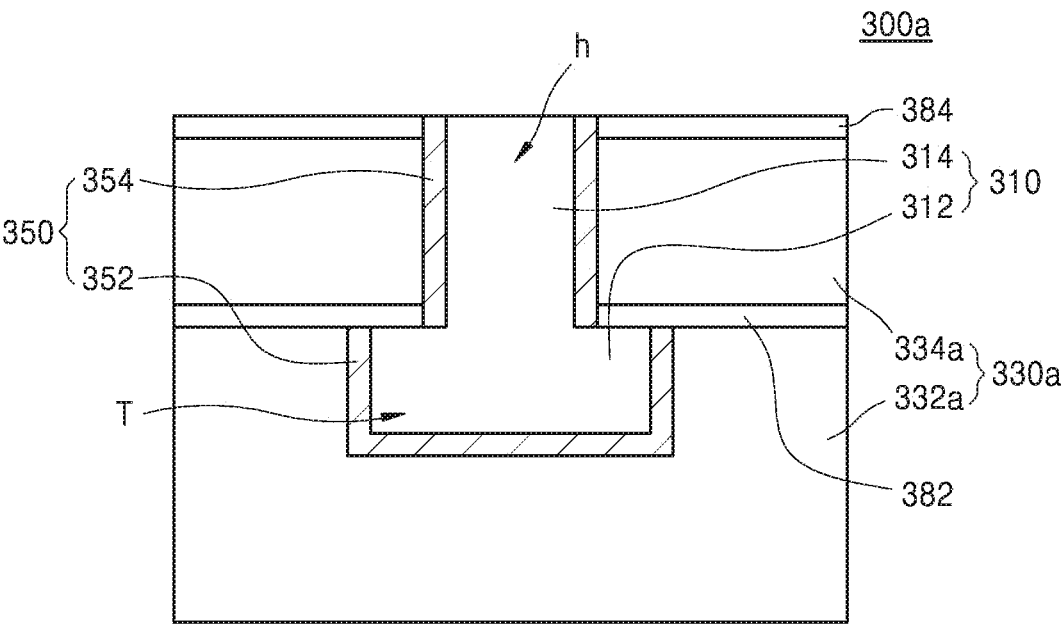
FIG. 19 is a view illustrating an interconnector including a hole according to some example embodiments.
Figure 20:
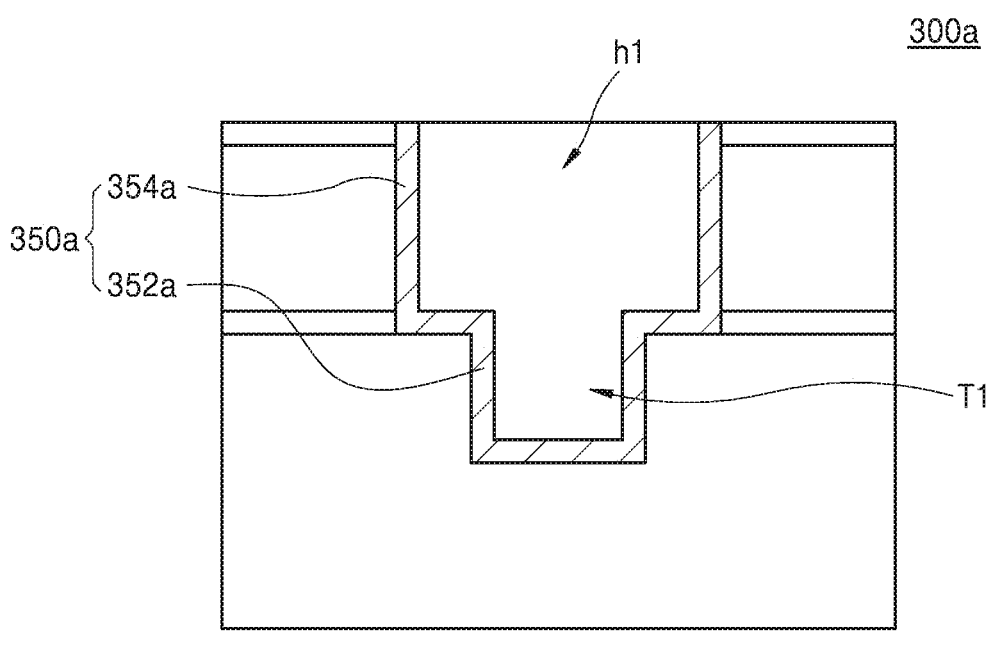
FIG. 20 is a view illustrating an interconnector including a hole according to some example embodiments.

FIGS. 19 and 20 are views illustrating interconnectors 300a and 300b including holes according to embodiments. Referring to FIG. 19, the interconnector 300a may include: a first dielectric layer 332a in which a trench T is formed;

and a second dielectric layer 334a which is provided on the first dielectric layer 332a and in which a via hole h is formed. The trench T formed in the first dielectric layer 332a may be filled with a first metal layer 312, and the via hole h formed in the second dielectric layer 334a may be filled with a second metal layer 314. In addition, the first metal layer 312 and the second metal layer 314 may be electrically connected to each other.

Alternatively or additionally, the interconnector 300a may further include: a first etch stop layer 382 provided between the first dielectric layer 332a and the second dielectric layer 334a; and a second etch stop layer 384 provided on an upper surface of the second dielectric layer 334a. The first and second etch stop layers 382 and 384 may include SiN, SiON, SiC, SiCN, or a combination thereof. The first and second etch stop layers 382 and 384 may be used to selectively etch the first and second dielectric layers 332a and 334b when the interconnector 300a is manufactured through a damascene process.

Because the interconnector 300a is formed through a damascene process, the vertical profile of the via hole h is improved such that the breakdown voltage of the interconnector 300a may be increased. An interlayer 350 may be disposed between a metal layer 310 and a dielectric layer 330a. The interlayer 350 may include a first interlayer 352 disposed on an inner wall of the trench T and a second interlayer 354 disposed on an inner wall of the via hole h.

The interlayer 350 may include a ternary metal oxide. For example, the interlayer 350 may include an $ABO_2$ compound (A and B are metal), where A may be any one of Pt, Pd, and Ag, and B may be any one of Co, Cr, Ni, and Rh. For example, the ternary metal oxide may include at least one selected from the group consisting of $PtCoO_2$, $PdCoO_2$, $PdCrO_2$, $PdRhO_2$, and $AgNiO_2$.

The interlayer 350 of the embodiment may have a delafossite crystal structure, and may have a resistivity of about $10^{-4}$ Ωcm (ohm-centimeters) or less. The thickness of the interlayer 350 may be about 15 nm or less.

FIG. 19 illustrates that the interlayer 350 is provided on both the inner wall of the trench T and the inner wall of the via hole h, but embodiments are not limited thereto. For example, the interlayer 350 may be provided only on a portion of the inner wall of the trench T and a portion of the inner wall of the via hole h.

Alternatively, as shown in FIG. 20, the width of a via hole h1 of the interconnector 300b may be greater than the width of a trench T1. In addition, a first interlayer 352a and a second interlayer 354a may be in contact with each other to form one interlayer 350a. Although FIG. 20 shows that the width of the via hole h1 is greater than the width of the trench T1, embodiments are not limited thereto. For example, even when the width of the via hole h1 is less than the width of the trench T1, the first and second interlayers 352a and 354a may be in contact with each other to form one interlayer.

Figure 21:
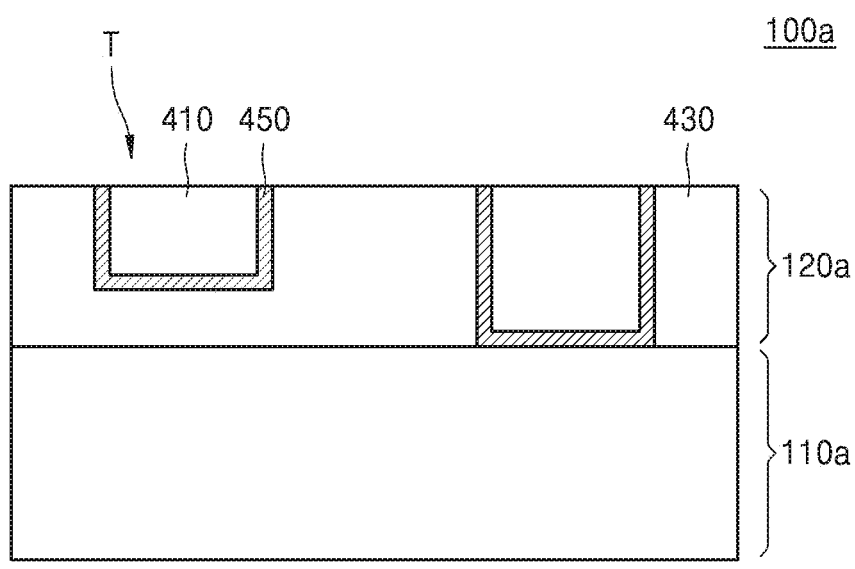
FIG. 21 is an example view illustrating an electronic apparatus including an interconnector according to some example embodiments.

FIG. 21 is an example view illustrating an electronic apparatus 100a including an interconnector 120a according to some example embodiments.

Referring to FIG. 21, the electronic apparatus 100a includes a substrate 110a and the interconnector 120a provided on the substrate 110a. Here, the interconnector 120a may include a metal layer 410, a dielectric layer 430, and an interlayer 450.

The substrate 110a may be a semiconductor substrate. For example, the substrate 110a may include a Group IV semiconductor material, a Group III/V semiconductor compound, or a Group II/VI semiconductor compound. For example, the substrate 110a may include Si, Ge, SiC, SiGe, SiGeC, a Ge Alloy, GaAs, InAs, InP, or the like. However, the listed materials are merely examples, and other various semiconductor materials may be included in the substrate 112.

The substrate 110a may include a single layer or a plurality of layers in which different materials are stacked. The substrate 110a may include, for example, an SOI substrate or an SGOI substrate. In addition, the substrate 110a may include a non-doped semiconductor material or a doped semiconductor material.

At least one semiconductor device (not shown) may be included in the substrate 110a. Here, the semiconductor device may include, for example, at least one of a transistor, a capacitor, a diode, and a resistor. However, example embodiments are not limited thereto.

The dielectric layer 430 is formed on the substrate 110a. The dielectric layer 430 may have a single-layer structure or a multi-layer structure in which different materials are stacked. The dielectric layer 430 may include a dielectric material used in a general semiconductor manufacturing process. For example, the dielectric layer 430 may include a silicon oxide, a nitride, silicon nitride, silicon carbide, silicate, or the like. However, the listed materials are merely examples, and other various dielectric materials may be included in the dielectric layer 430. In addition, the dielectric layer 430 may include an organic dielectric material.

At least one trench T having a given depth may be formed in the dielectric layer 430. Here, the trench T may reach the substrate 110a or may not reach the substrate 110a. In the example shown in FIG. 21, two trenches T are formed in the dielectric layer 430: one of the trenches T reaches the substrate 110a, and the other of the trenches T does not reach the substrate 110a.

The trench T is filled with the metal layer 410. The interlayer 450 is provided on an inner wall of the trench T. Here, the interlayer 450 may be provided between the dielectric layer 430 and the metal layer 410 to cover the metal layer 410. For example, the interlayer 450 may be provided on the inner wall of the trench T to cover lateral and lower surfaces of the metal layer 410. An upper surface of the metal layer 410 may be exposed through the interlayer 450. The interlayer 450 serves as an adhesive layer between the dielectric layer 430 and the metal layer 410, and also enhances the crystallization of the metal layer 410.

The interlayer 450 may include a ternary metal oxide. For example, the interlayer may include an $ABO_2$ compound (A and B are metal), where A is any one of Pt, Pd, and Ag, and B may be any one of Co, Cr, Ni, and Rh. For example, the ternary metal oxide may include at least one selected from the group consisting of $PtCoO_2$, $PdCoO_2$, $PdCrO_2$, $PdRhO_2$, and $AgNiO_2$.

The interlayer 450 of the embodiment may have a delafossite crystal structure, and may have a resistivity of about $10^{-4}$ Ωcm or less. The thickness of the interlayer 450 may be about 15 nm or less.

Figure 22:
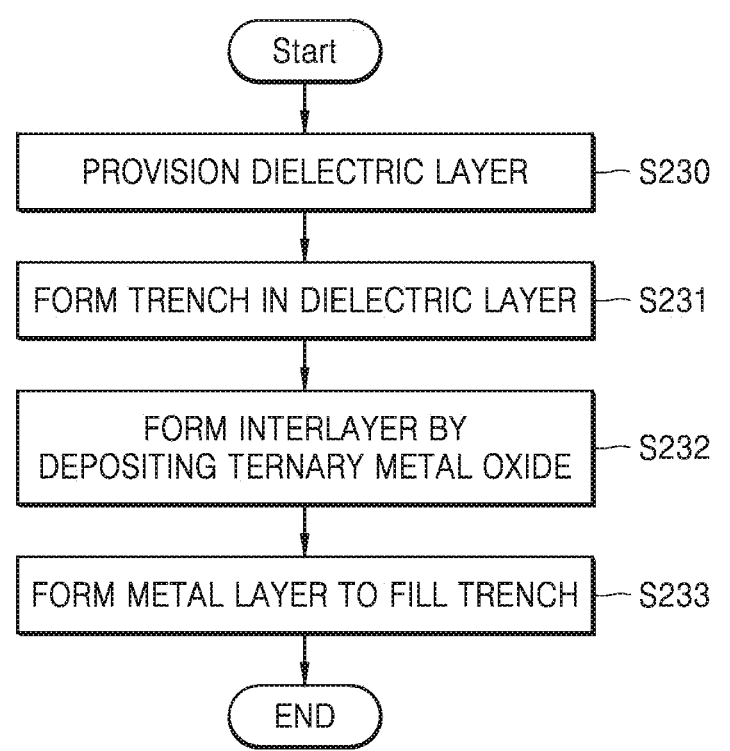
FIG. 22 is a flow chart illustrating a method of fabricating an interposer according to some example embodiments.

FIG. 22 is an illustration of a method of fabricating an interposer, according to some example embodiments.

Referring to FIG. 22, a dielectric layer may be provisioned (S230). The dielectric layer may include an oxide, such as silicon dioxide.

A trench may be formed in the dielectric layer (S231). The trench may be formed with a plasma etching process.

A ternary metal oxide layer may be formed in sidewalls of the trench, and along an upper surface of the dielectric layer (S232).

A metal layer may be deposited in the trench (S233). The metal layer may have a face-centered cubic structure and/or a hexagonal structure.

As described above, according to the one or more of the above example embodiments, the interconnector uses a ternary metal oxide as an interlayer and may thus improve the reliability and durability of wiring.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Moreover, when the words "generally" and "substantially" are used in connection with material composition, it is intended that exactitude of the material is not required but that latitude for the material is within the scope of the disclosure.

Further, regardless of whether numerical values or shapes are modified as "about" or "substantially," it will be understood that these values and shapes should be construed as including a manufacturing or operational tolerance (e.g., ±10%) around the stated numerical values or shapes. Thus, while the term "same," "identical," or "equal" is used in description of example embodiments, it should be understood that some imprecisions may exist. Thus, when one element or one numerical value is referred to as being the same as another element or equal to another numerical value, it should be understood that an element or a numerical value is the same as another element or another numerical value within a desired manufacturing or operational tolerance range (e.g., ±10%).

It should be understood that various example embodiments described herein should be considered in a descriptive sense only and not for purposes of limitation. Descriptions of features or aspects within each embodiment should typically be considered as available for other similar features or aspects in other example embodiments, and example embodiments are not necessarily mutually exclusive with one another. While one or more example embodiments have been described with reference to the figures, it will be understood by those of ordinary skill in the art that various changes in form and details may be made therein without departing from the spirit and scope of the disclosure as defined by the following claims.

What is claimed is:

1. An interconnector comprising:
a dielectric layer with a trench;
a metal layer in the trench of the dielectric layer so that a lower surface and both lateral surfaces of the metal layer are surrounded by the dielectric layer; and
an interlayer between the metal layer and the dielectric layer in the trench and comprising a ternary metal oxide.

2. The interconnector of claim 1, wherein the ternary metal oxide comprises a crystal structure corresponding to that of delafossite.

3. The interconnector of claim 1, wherein the ternary metal oxide comprises an $ABO_2$ compound where A and B are metals.

4. The interconnector of claim 3, wherein A of the ternary metal oxide is any one of Pt, Pd, and Ag, and B of the ternary metal oxide is any one of Co, Cr, Ni, and Rh.

5. The interconnector of claim 1, wherein the ternary metal oxide comprises at least one of $PtCoO_2$, $PdCoO_2$, $PdCrO_2$, $PdRhO_2$, and $AgNiO_2$.

6. The interconnector of claim 1, wherein the interlayer has a thickness of about 15 nm or less.

7. The interconnector of claim 1, wherein the metal layer has a thickness of about 5 nm to about 50 nm.

8. The interconnector of claim 1, wherein the metal layer has a width of about 50 nm or less.

9. The interconnector of claim 1, wherein the interlayer has a bulk resistivity of about $10^{-5}$ Ωcm or less.

10. The interconnector of claim 1, wherein the interlayer has a resistivity of about $10^{-4}$ Ωcm or less.

11. The interconnector of claim 1, wherein the interlayer comprises an element which is included in the dielectric layer and is not oxygen.

12. The interconnector of claim 1, wherein the dielectric layer comprises a first dielectric layer defining trench having a given depth,
the interlayer comprises a first interlayer on an inner wall of the trench, and
the metal layer comprises a first metal layer that fills the trench.

13. The interconnector of claim 1, wherein the dielectric layer comprises a second dielectric layer defining a via hole,
the interlayer comprises a second interlayer on an inner wall of the via hole, and
the metal layer comprises a second metal layer that fills the via hole.

14. An electronic apparatus comprising:
a device layer comprising at least one of an active device, a capacitor, and a resistor; and
the interconnector of claim 1, which is connected to the device layer.

15. The electronic apparatus of claim 14, wherein the device layer comprises at least one of a memory device, a display device, and an integrated circuit device.

16. A method of forming an interposed, comprising:
provisioning a porous, single-layer dielectric layer;
forming a trench in the porous, single-layer dielectric layer;
depositing a ternary metal oxide in a sidewall of the trench; and
filling the trench with a metal, wherein
the porous, single-layer dielectric layer surrounds a bottom of and side surfaces of the trench.

17. The method of claim 16, wherein the ternary metal oxide includes any one of Pt, Pd, and Ag, and B of the ternary metal oxide is any one of Co, Cr, Ni.

18. The method of claim 16, wherein the forming the trench includes performing a plasma etching process.

19. The method of claim 16, wherein the metal comprises at least one of Cu, Ag, Au, Al, Pt, Pd, Rh, Ir, and Ru.

20. The method of claim 16, further comprising:
performing a heat treatment process after filling the trench.

* * * * *